United States Patent
Tung et al.

(10) Patent No.: US 12,394,714 B2
(45) Date of Patent: Aug. 19, 2025

(54) SEMICONDUCTOR DEVICE INCLUDING DIELECTRIC INSERT STRUCTURE DIRECTLY UNDER BURIED WORD LINE AND METHOD FOR FORMING THE SAME

(71) Applicant: Fujian Jinhua Integrated Circuit Co., Ltd., Quanzhou (CN)

(72) Inventors: Yu-Cheng Tung, Quanzhou (CN); Janbo Zhang, Quanzhou (CN)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 451 days.

(21) Appl. No.: 17/858,100

(22) Filed: Jul. 6, 2022

(65) Prior Publication Data

US 2023/0335491 A1 Oct. 19, 2023

(30) Foreign Application Priority Data

Apr. 18, 2022 (CN) .......................... 202210406371.4
Apr. 18, 2022 (CN) .......................... 202220894082.9

(51) Int. Cl.
*H01L 21/762* (2006.01)
*H01L 23/522* (2006.01)
*H01L 23/528* (2006.01)
*H01L 23/532* (2006.01)
*H10B 12/00* (2023.01)

(52) U.S. Cl.
CPC .... *H01L 23/5283* (2013.01); *H01L 21/76224* (2013.01); *H01L 23/5226* (2013.01); *H01L 23/53295* (2013.01); *H10B 12/053* (2023.02); *H10B 12/34* (2023.02); *H10B 12/488* (2023.02)

(58) Field of Classification Search
None
See application file for complete search history.

(56) References Cited

U.S. PATENT DOCUMENTS

| | | | |
|---|---|---|---|
| 9,093,297 B2 | 7/2015 | Song | |
| 11,195,950 B2 | 12/2021 | Kim | |
| 2009/0148995 A1* | 6/2009 | Chang | H10D 30/608 |
| | | | 257/E21.409 |
| 2011/0018057 A1 | 1/2011 | Kim | |
| 2011/0260242 A1* | 10/2011 | Jang | H10D 64/513 |
| | | | 438/270 |
| 2015/0008512 A1* | 1/2015 | Lemke | H10D 64/513 |
| | | | 438/424 |
| 2020/0161306 A1 | 5/2020 | Seo | |
| 2021/0005506 A1* | 1/2021 | Kim | H01L 29/66621 |
| 2023/0055933 A1* | 2/2023 | Guo | H10B 12/34 |
| 2023/0108547 A1* | 4/2023 | Chang | H01L 21/76224 |
| | | | 257/424 |

* cited by examiner

*Primary Examiner* — Kretelia Graham
*Assistant Examiner* — William Henry Anderson
(74) *Attorney, Agent, or Firm* — Winston Hsu

(57) ABSTRACT

A semiconductor device includes a substrate having a plurality of parallel active regions, an isolation structure in the substrate to separate the active regions, a buried word line disposed in the substrate and cutting through the isolation structure and the active regions, and a dielectric insert structure disposed in the substrate, directly under the buried word line and between end portions of adjacent two of the active regions. A bottom surface of the dielectric insert structure is lower than a bottom surface of the isolation structure.

17 Claims, 10 Drawing Sheets

SEMICONDUCTOR DEVICE INCLUDING DIELECTRIC INSERT STRUCTURE DIRECTLY UNDER BURIED WORD LINE AND METHOD FOR FORMING THE SAME

BACKGROUND OF THE INVENTION

1. Field of the Invention

The present invention relates to a semiconductor device and a method for forming the same. More particularly, the present invention relates to a dynamic random access memory (DRAM) having dielectric insert structures disposed under buried word lines and a method for forming the same.

2. Description of the Prior Art

A dynamic random access memory (DRAM) device is a kind of volatile memory. A DRAM device usually includes a memory region including an array of memory cells and a peripheral region including control circuits. Typically, a memory cell includes of one transistor and one capacitor electrically coupled to the transistor, which is also known as a 1T1C cell. A digital data is stored in a memory cell by controlling the transistor to charge or discharge the capacitor. The control circuits in the peripheral region may address each of the memory cells in the array region to read, write or erase data by columns of word lines and rows of bit lines that respectively traverse through the array region and are electrically connected to each of the memory cells.

In advanced technology, three-dimensional (3D) structure including buried word lines and stacked capacitors has been widely used to shrink the memory cells to form DRAM devices having higher array density. As the memory cells are arranged in higher density, it has become an important subject to ensure the electrical isolation between memory cells to reduce leakage and signal crosstalk between the memory cells.

SUMMARY OF THE INVENTION

One objective of the present invention is to provide a semiconductor device and a method for forming the same, which includes forming a plurality of dielectric insert structures below the buried word lines and the isolation structure between the end portions of adjacent active regions. The electrical isolation between the active regions may be improved, and leakage and signal crosstalk between memory cells may be reduced.

One embodiment of the present invention provides a semiconductor device including a substrate including a plurality of active regions which are parallel to each other and arranged to form an array, an isolation structure in the substrate to separate the active regions, a buried word line disposed in the substrate and cutting through the isolation structure and the active regions, and a dielectric insert structure disposed in the substrate, directly under the buried word line and between end portions of adjacent two of the active regions, wherein a bottom surface of the dielectric insert structure is lower than a bottom surface of the isolation structure.

Another embodiment of the present invention provides a method for forming a semiconductor device including the steps of providing a substrate, forming an isolation trench in the substrate to define a plurality of active regions, forming a first dielectric layer in the isolation trench and comprising a plurality of deep holes that are respectively located between end portions of adjacent two of the active regions, performing an etching process to extend each of the deep holes into the substrate and being lower than a bottom surface of the isolation trench, forming a second dielectric layer filling the deep holes, forming a word line trench in the substrate and cutting through the active regions, the first dielectric layer, and the second dielectric layer, wherein portions of the second dielectric layer at bottom portions of the deep holes become a plurality of dielectric insert structures under the word line trench, and forming a buried word line in the word line trench.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

The accompanying drawings are included to provide a further understanding of the embodiments, and are incorporated in and constitute a part of this specification. The drawings illustrate some of the embodiments and, together with the description, serve to explain their principles. Relative dimensions and proportions of parts of the drawings have been shown exaggerated or reduced in size, for the sake of clarity and convenience in the drawings. The same reference signs are generally used to refer to corresponding or similar features in modified and different embodiments.

FIG. 1, FIG. 3 and FIG. 7 are plan views of the semiconductor device. FIG. 2, FIG. 4, FIG. 5, FIG. 6, FIG. 8 and FIG. 9 are cross-sectional views of the semiconductor device taken along the line AA' and the line BB' as shown in the plan view.

DETAILED DESCRIPTION

To provide a better understanding of the present invention to those of ordinary skill in the art, several exemplary embodiments of the present invention will be detailed as follows, with reference to the accompanying drawings using numbered elements to elaborate the contents and effects to be achieved. Other embodiments may be utilized and that structural, logical and electrical changes may be made without departing from the spirit and scope of the present invention.

Figure 1:
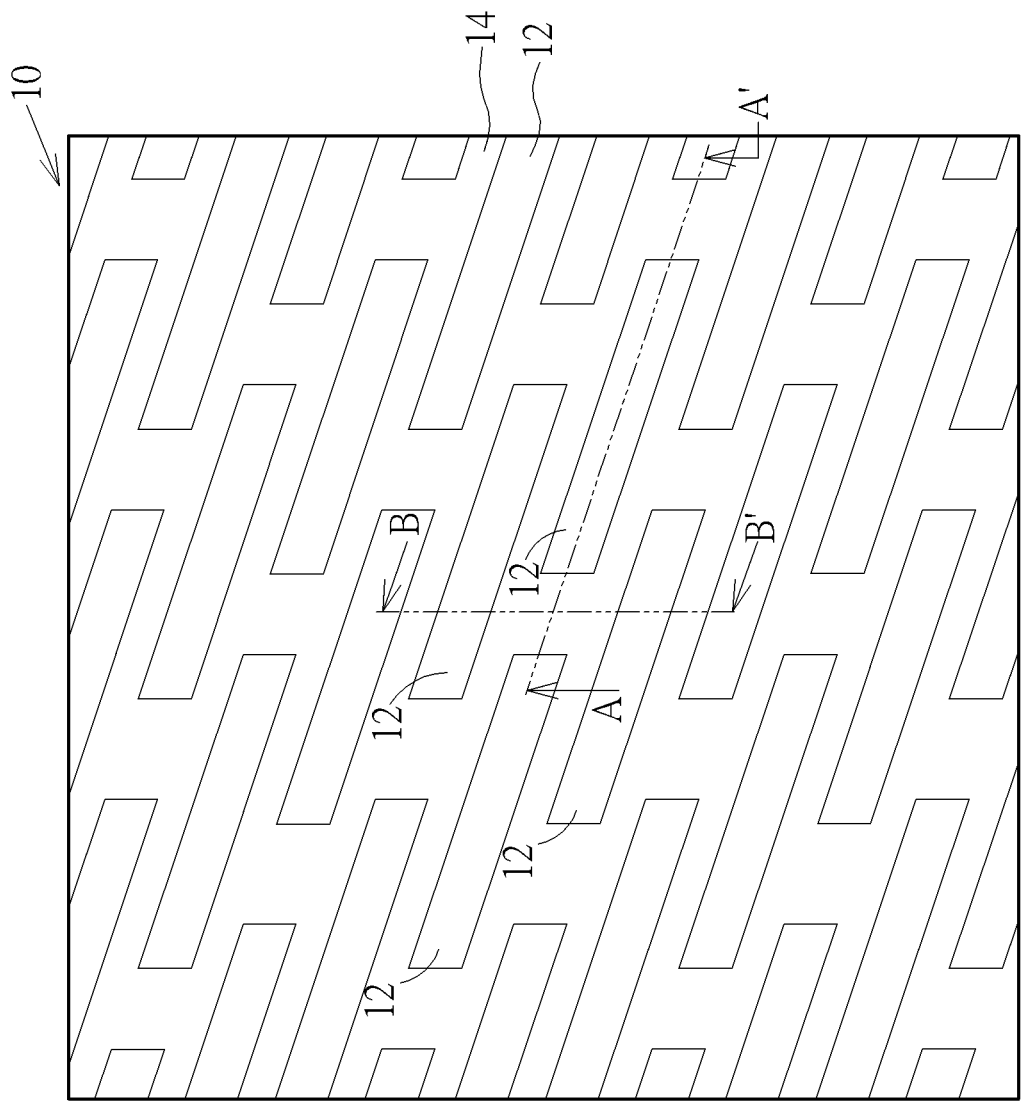
FIG. 1 to FIG. 9 are schematic drawings illustrating the steps for forming a semiconductor device according to an embodiment of the present invention.
Figure 2:
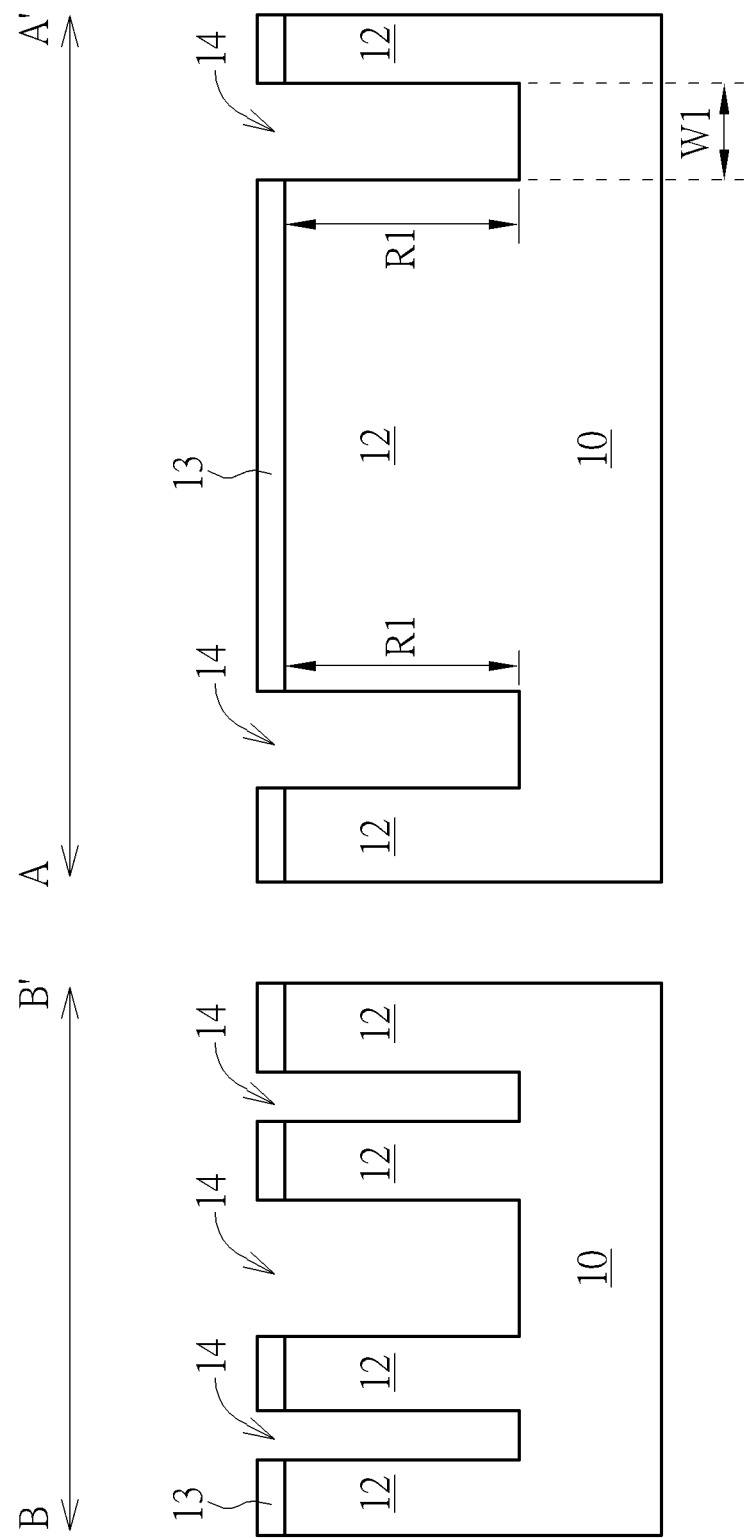

Please refer to FIG. 1 to FIG. 9, which are schematic drawings illustrating the steps for forming a semiconductor device according to an embodiment of the present invention. As shown in FIG. 1 and FIG. 2, a substrate 10 is provided. Directions D1, D2 and D3 are defined on the substrate 10 for the convenience of illustrating the structure of the semiconductor device. The directions D1, D2 and D3 different directions and are parallel to the surface of the substrate 10. The directions D1 and D2 are perpendicular to each other. The direction D3 and the direction D1 may include an angle between 30 and 75 degrees. The substrate 10 is made of a semiconductor material and may be a silicon substrate, an epitaxial silicon substrate, a silicon germanium (SiGe) substrate, a silicon carbide (SiC) substrate, or a silicon-on-insulator (SOI) substrate, but is not limited thereto. The substrate 10 may include a well region (not shown) of a first conductivity type. According to an embodiment of the present invention, the well-region is p-type and may be formed by implanting the substrate 10 with p-type dopants such as boron (B), aluminum (Al), gallium (Ga), or a combination thereof, but is not limited thereto. A hard mask layer 13 may be disposed on the surface of the substrate 10. The hard mask layer 13 may be made of silicon nitride, but is not limited thereto. Following, the substrate 10 is etched to form an isolation trench 14 to define a plurality of active regions 12 in the substrate 10. The active regions 12 respectively have a length extending along the direction D3 and are arranged in parallel and staggered with each other to form an array. The line AA' cuts through the active regions 12 along the direction D3. The line BB' cuts through the active regions 12 along the direction D2. As shown in the right portion of FIG. 2, the isolation trench 14 between end portions of adjacent active regions 12 may have a width W1 along the line AA' (along the direction D3) and a depth R1 from the surface of the substrate 10.

Figure 3:
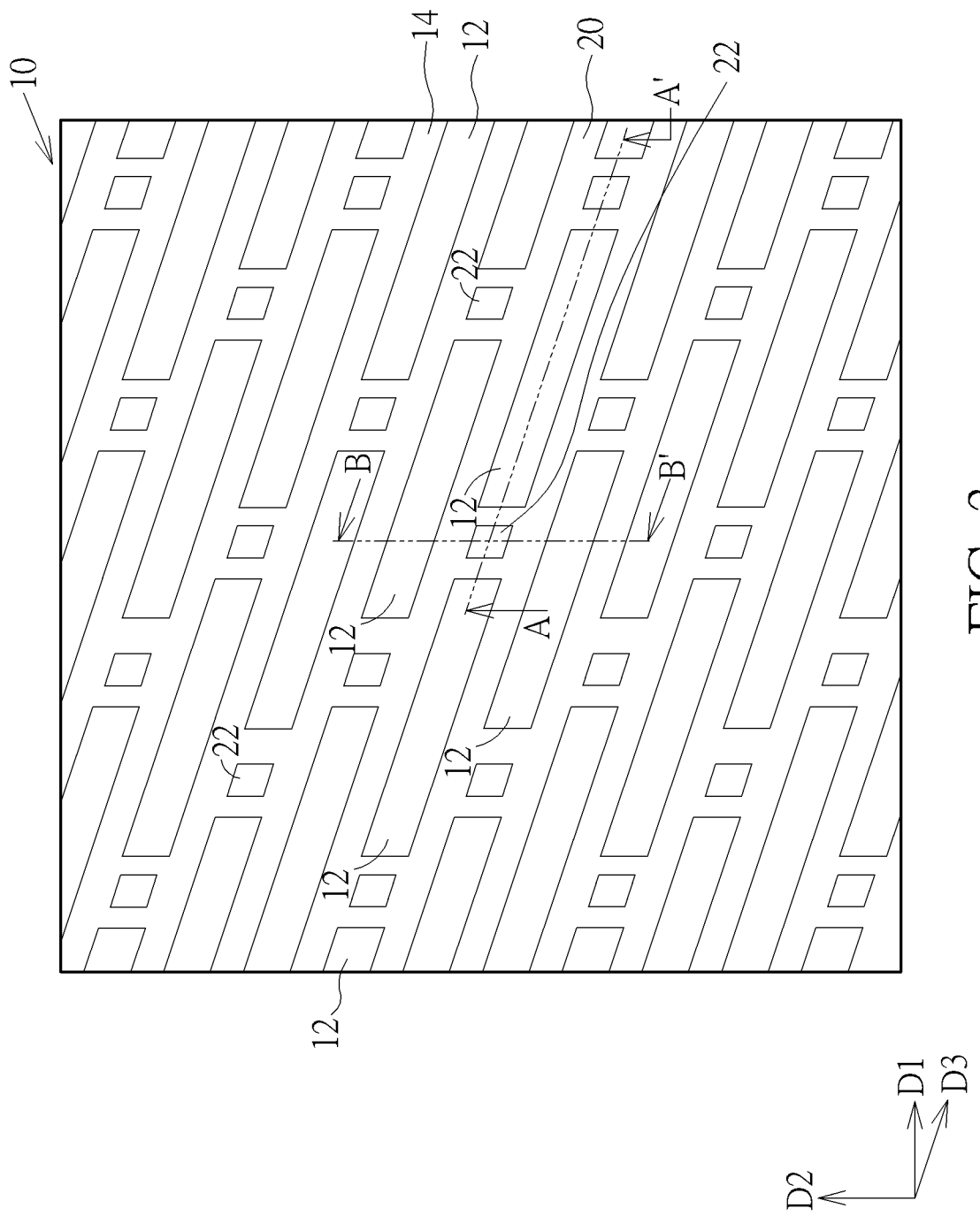
Figure 4:
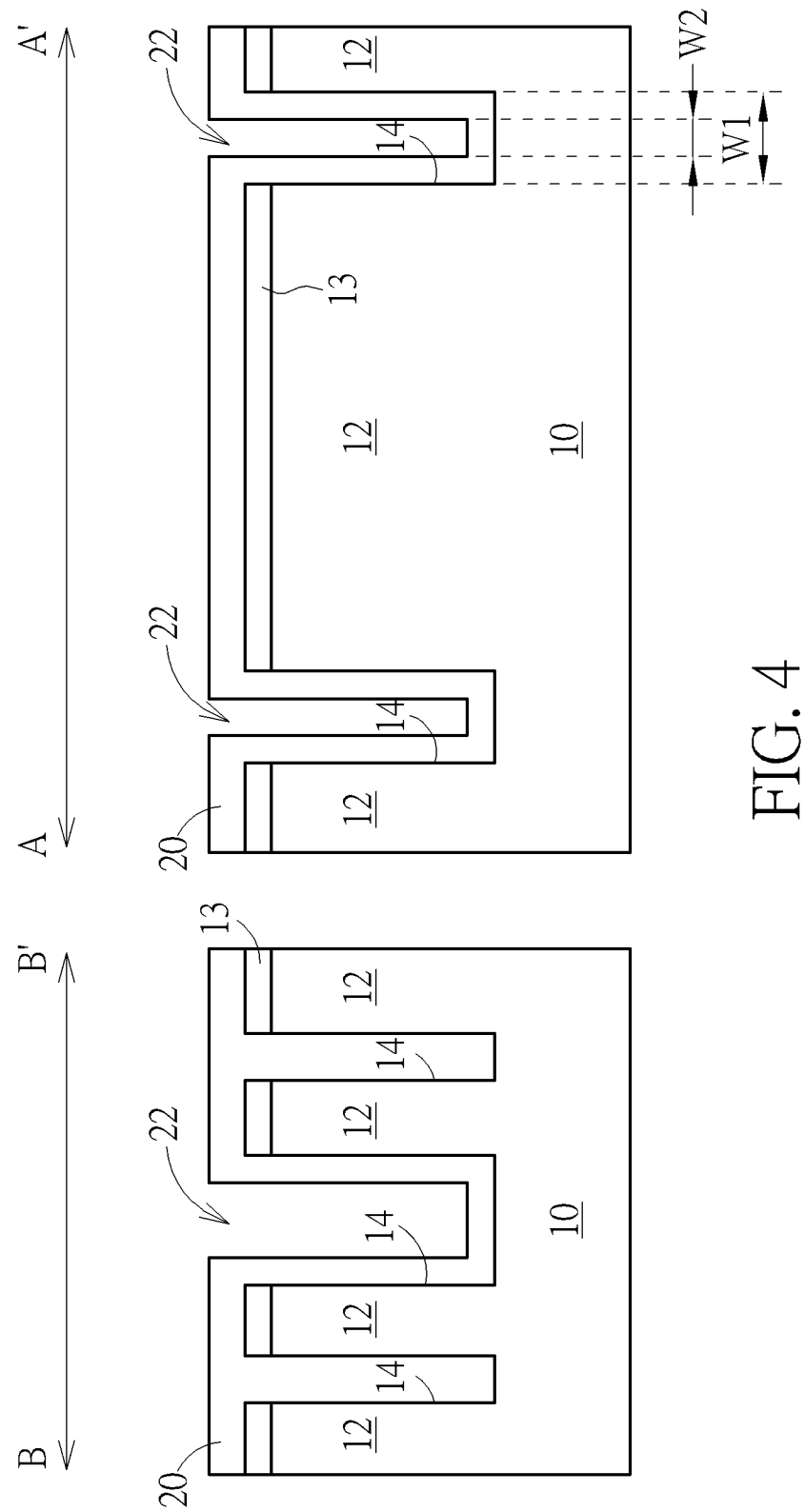

Subsequently, as shown in FIG. 3 and FIG. 4, a first dielectric layer 20 is formed on the substrate 10 to cover the active regions 12 and the isolation trench 14. It is important that the first dielectric layer 20 has a thickness sufficient to completely fill the isolation trench 14 between the sidewalls of the active regions 12 but not to completely fill the isolation trench 14 between end portions of adjacent active regions 12, such that a plurality of deep holes 22 are formed and respectively between end portions of two adjacent active regions 12. For the sake of clarity, the active regions 12 that are fully covered by the first dielectric layer 20 are shown in FIG. 3 to better understand the relative positions of the active regions 12 and the deep holes 22.

Figure 5:
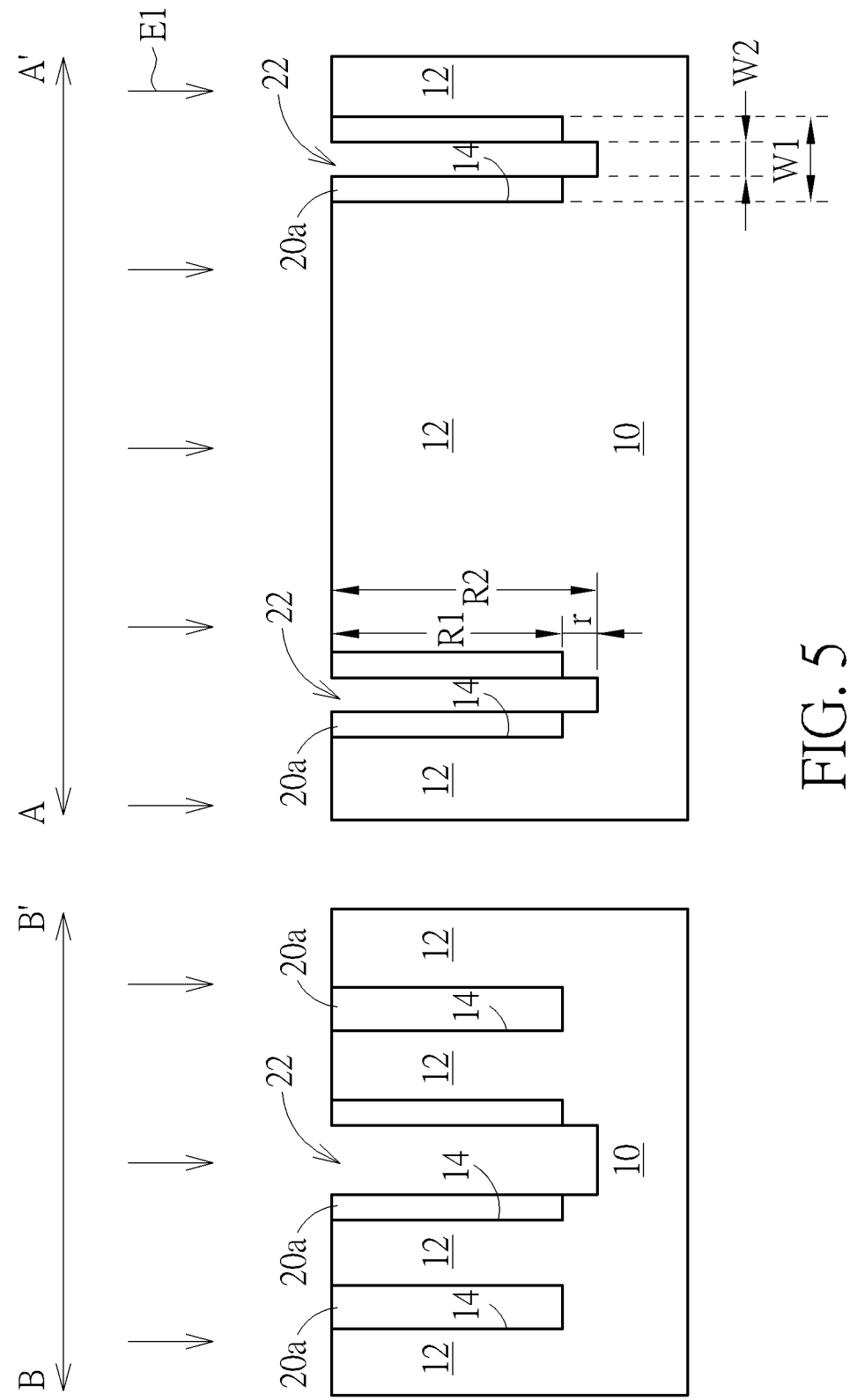

Subsequently, as shown in FIG. 5, an etching process E1 is performed to extend the bottom portions of the deep holes 22 into the substrate 10. The etching process E1 may include multiple etching steps. For example, a first etching step (such as a dry etching step) is performed to anisotropically remove the first dielectric layer 20 on the hard mask layer 13 and the bottom surfaces of the deep holes 22 until exposing the hard mask layer 13 and portions of the substrate 10 directly under the deep holes 22. Following, a second etching step (such as another dry etching step or a wet etching step) is performed, through the deep holes 22 to selectively etch away the exposed portions of the substrate 10, thereby extending the bottom portions of the deep holes 22 to be lower than the bottom surface of the isolation trench 14 and into the substrate 10. During the second etching step, the hard mask layer 13 and the first dielectric layer 20 may protect other portions of the substrate 10 from being etched. As shown in the right portion of FIG. 5, after the etching process E1, the deep holes 22 may respectively have a depth R2 from the surface of the substrate 10, which is different from the depth R1 of the isolation trench 14 by a difference r. According to an embodiment of the present invention, the difference r may be approximately 1/5 to 1/10 of the depth R1, but is not limited thereto. The first dielectric layer 20 filled in the isolation trench 14 becomes the isolation structure 20a. The deep holes 22 are surrounded by the isolation structure 20a and do not expose any end portion of the active regions 12. After the etching process E1, another selective etching process may be performed to remove the hard mask layer 13 from the surface of the substrate 10. Alternatively, the hard mask layer 13 may be kept on the substrate 10 to serve as a stop layer or a buffer layer in a following planarization process.

Figure 6:
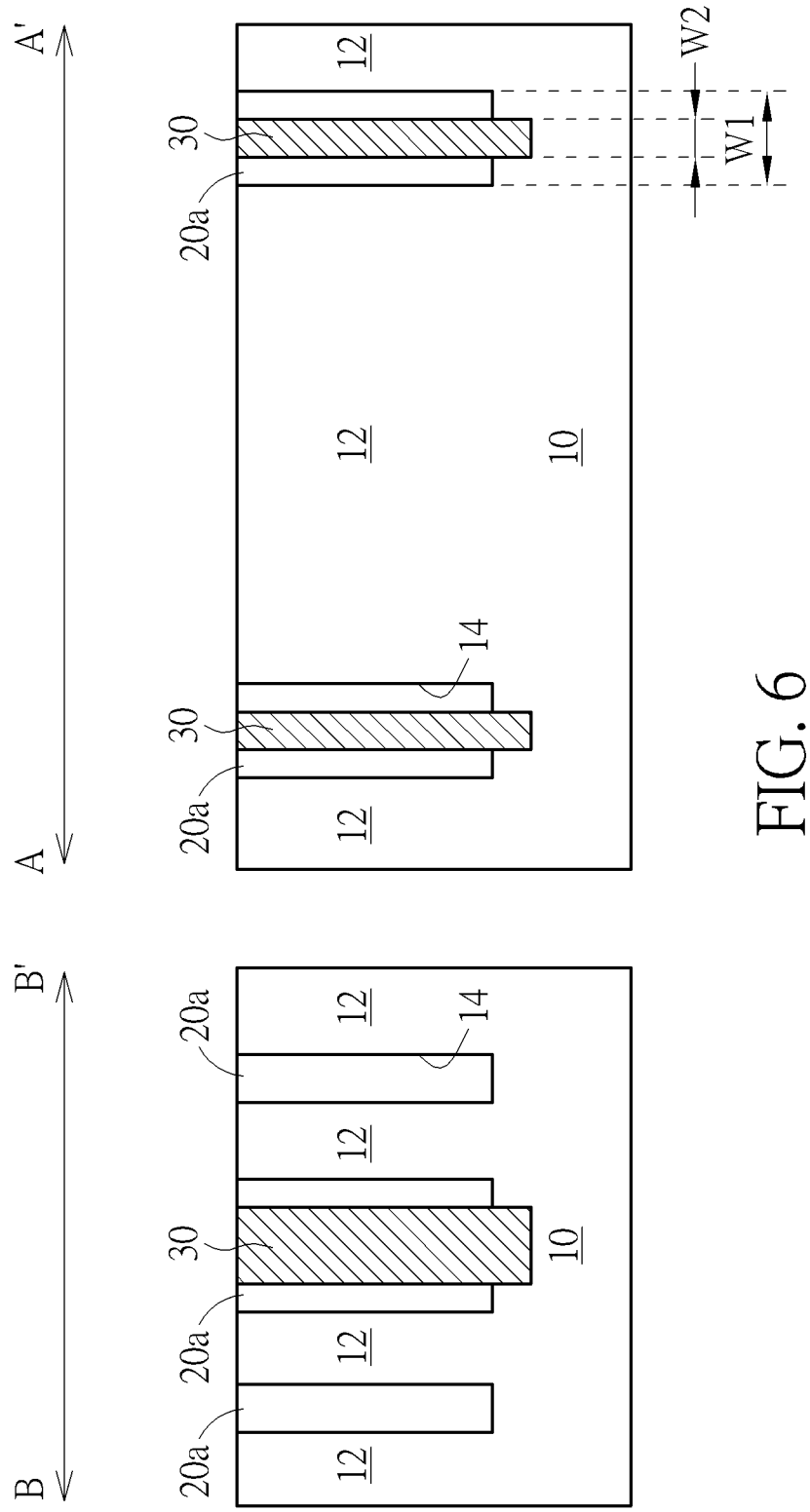

Following, as shown in FIG. 6, a deposition process (such as a chemical vapor deposition process, a physical vapor deposition process, or an atomic layer deposition process) is performed to form a second dielectric layer 30 on the substrate 10 and completely filling the deep holes 22. A planarization process or an etching process may be performed to remove the second dielectric layer 30 outside the deep holes 22. The second dielectric layer 30 is made of a dielectric material such as silicon oxide, silicon nitride, silicon oxynitride, or a combination thereof, but is not limited thereto. According to an embodiment of the present invention, the first dielectric layer 20 and the second dielectric layer 30 are made of different dielectric materials. In an embodiment, the first dielectric layer 20 is made of silicon oxide, and the second dielectric layer 30 is made of silicon nitride. The second dielectric layer 30 may be used as a solid-state doping (SSD) source layer, and may include neutral dopants (such as carbon) or dopants of a specific conductivity type. In some embodiments, the second dielectric layer 30 may include dopants of a second conductivity type opposite to the first conductivity type of the well region. In some embodiments, the second dielectric layer 30 includes n-type dopants, such as phosphorus (P), arsenic (As), or a combination thereof, but is not limited thereto.

Figure 7:
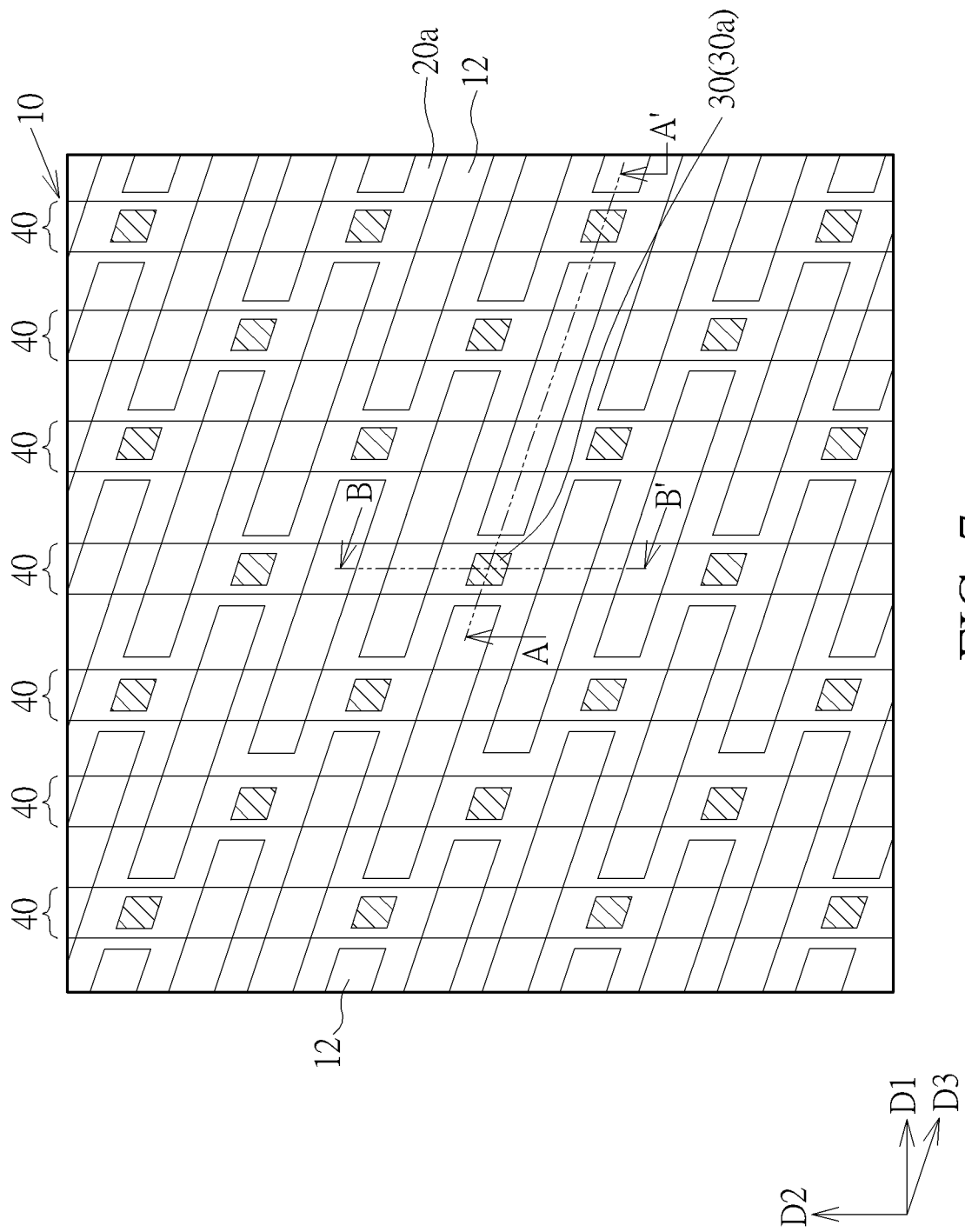
Figure 8:
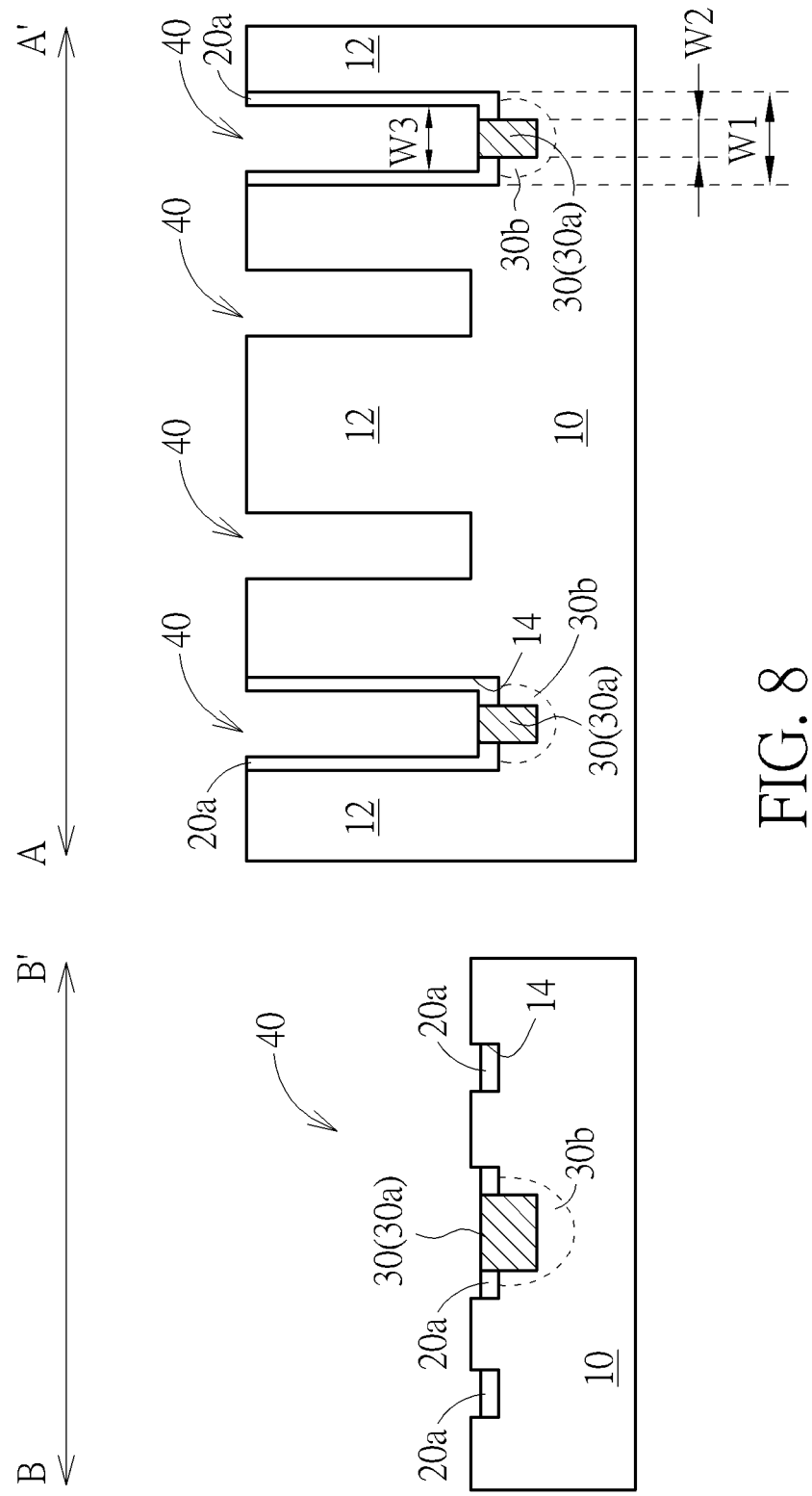

Following, as shown in FIG. 7 and FIG. 8, an etching process is performed to form a plurality of word line trenches 40 in the substrate 10. The word line trenches 40 respectively extend along the direction D1 and cut through the active regions 12, the isolation structure 20a (the first dielectric layer 20) in the isolation trench 14 and the second dielectric layer 30 in the deep holes 22. The portions of the second dielectric layer 30 remained in the bottom portions of the deep holes 22 become a plurality of dielectric insert structures 30a that are directly under the word line trenches. Due to different etching rates between the substrate 10, the first dielectric layer 20 and the second dielectric layer 30, the word line trenches 40 may have non-flat bottom surfaces along their respective lengths. For example, as shown in the left portion of FIG. 8, along the bottom surface of a word line trench 40, the dielectric insert structures 30a (only one dielectric insert structure 30a is shown) and the isolation structure 20a are more recessed than the substrate 10 and are not coplanar with the surface of the substrate 10. As shown in the right portion of FIG. 8. The depths of the word line trenches 40 are smaller than the depth of the isolation trench 14. The bottom surface of the isolation trench 14 is lower than the bottom surfaces of the word line trenches 40. Each of the word line trenches 40 may have a width W3 along the line AA' (along the direction D3). In this embodiment, the width W3 is smaller than the width W1 of the isolation trench 14, and is larger than the width W2 of the deep holes 22. The sidewalls of the end portions of the active regions 12 at two sides of each dielectric insert structure 30a may be completely covered by the isolation structure 20a and not exposed to the word line trenches 40. In other embodiments when the width W3 is approximately equal to or slight larger than the width W1 of the isolation trench 14, the isolation structure 20a on the sidewalls of the end portions of the active regions 12 may be removed when etching the word line trenches 40, and the sidewalls of the end portions of the active regions 12 are therefore exposed. The dielectric insert structures 30a formed from the second dielectric layer 30 at the bottom portions of the deep holes 22 may have the same width W2 as the deep holes 22. The upper sidewalls of the dielectric insert structures 30a are in direct contact with the isolation structure 20a. The lower sidewalls and bottom surfaces of the dielectric insert structures 30a are in direct contact with the substrate 10. In some embodiments when the dielectric insert structures 30a includes dopants and is used as a solid state doping (SSD) source layer, an anneal process may be performed to drive the dopants from the dielectric insert structures 30a into the substrate 10 after forming the word line trenches 40 to form the doped regions 30b in the substrate 10 and directly under the isolation trench 14. In some embodiments, the doped regions 30b have the second conductivity type, such as n-type.

Figure 9:
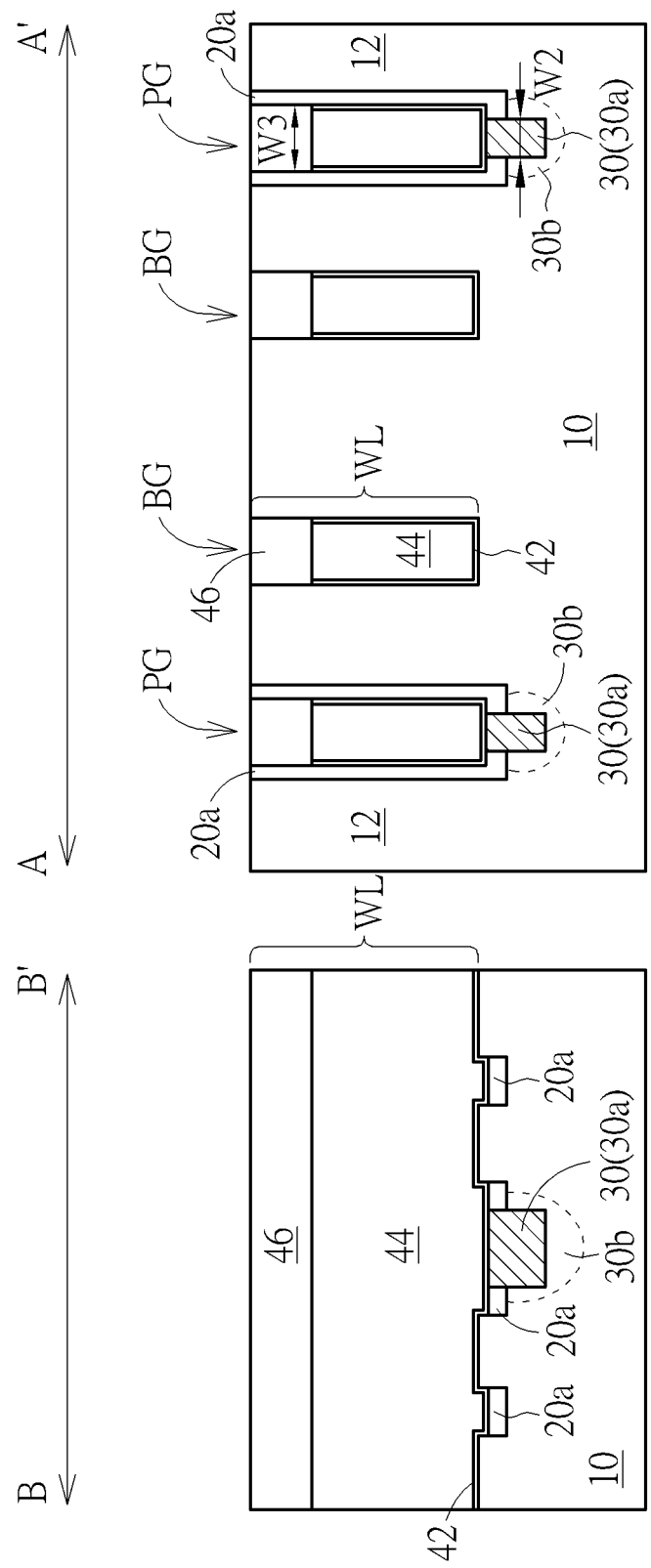

Subsequently, as shown in FIG. 9, a gate dielectric layer 42 is formed along the sidewall and bottom surface of each of the word line trenches 40, and a conductive layer 44 and a capping layer 46 are formed on the gate dielectric layer 42 and completely filling the word line trench 40, so that a buried word line WL is obtained in each of the word line trenches 40. The material of the gate dielectric layer 42 may include silicon oxide, silicon nitride, high-k dielectric materials, or a combination thereof, but is not limited thereto. The material of the conductive layer 44 may include titanium (Ti), tungsten (W), aluminum (Al), copper (Cu), gold (Au), work function metals, low resistance metals, or a combination thereof, but is not limited thereto. The capping layer 46 may include a dielectric material such as, silicon oxide, silicon nitride, silicon oxynitride, or a combination thereof, but is not limited thereto. In some embodiments, a barrier layer (not shown) may be disposed between the gate dielectric layer 42 and the conductive layer 44, wherein the material of the barrier layer may include titanium (Ti), titanium nitride (TiN), tantalum (Ta), tantalum nitride (TaN), tungsten nitride (TiW), or a combination thereof, but is not limited thereto.

By the manufacturing process illustrated above, the semiconductor device provided by the present invention is obtained. The semiconductor device may be used to fabricate a dynamic random access memory (DRAM). The portions of the buried word lines WL passing between end portions of adjacent active regions 12 may be referred to as passing gates PG. The portions of the buried word lines WL cutting through the active regions 12 may be referred to as the buried gates BG. The buried gates BG control turning-on and turning-off of the transistors of the memory cells. The passing gates PG electrically connect the transistors of the memory cells along the buried word lines WL. As the dimensions of the memory cells continue to shrink, the spaces between the active regions 12 are getting smaller, which may more likely induce parasitic devices formed at the end portions of the active regions 12 by the passing gates PG of the buried word lines WL after times of read and write operations. Leakage currents from the parasitic devices may cause signal crosstalk between the memory cells. The semiconductor device provided by the present invention may resolve the problem by forming the dielectric insert structures 30a directly under the passing gates PG of the buried word lines WL. The dielectric insert structures 30a are deeper than the isolation structure 20a and may improve electrical isolation between adjacent memory cells, so that signal crosstalk between the memory cells may be reduced. Furthermore, by forming a doped regions 30b with a conductivity type opposite to the conductivity type of the substrate 10 (or the well region), a depletion region may be formed to obstruct leakage currents between memory cells.

Figure 10:
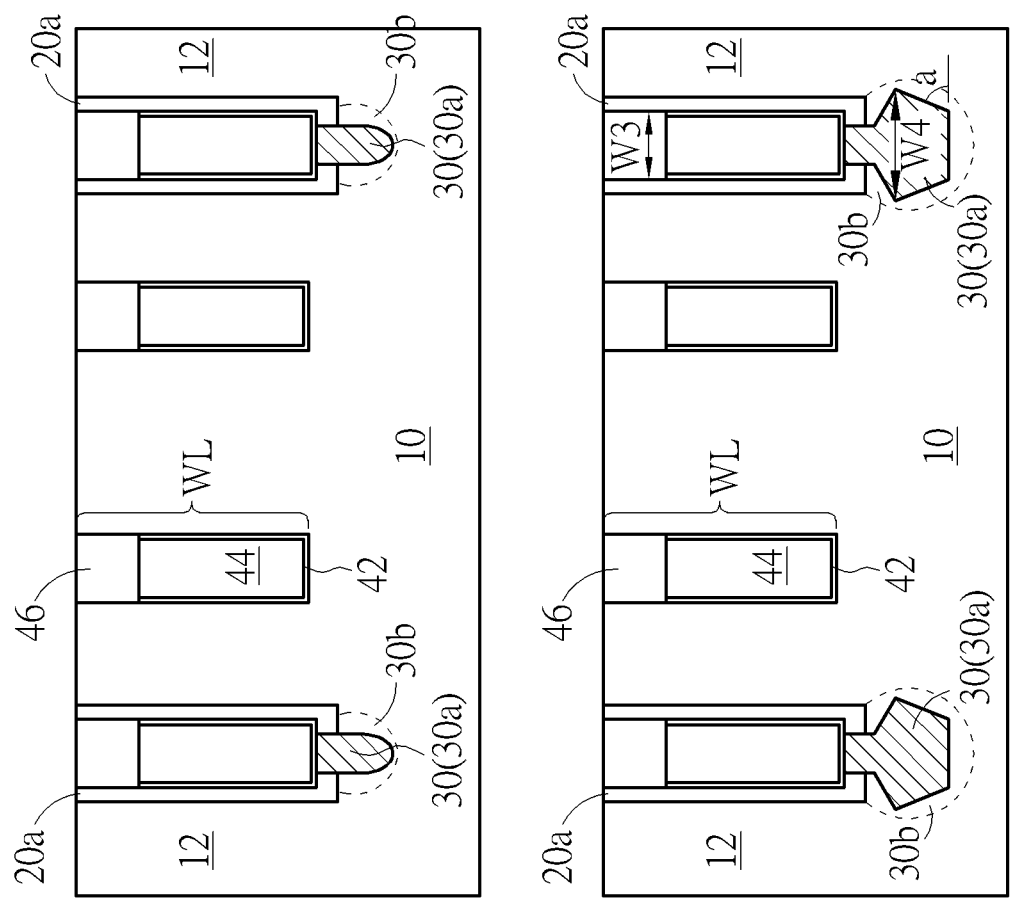
FIG. 10 is a schematic drawing showing a plan view of a semiconductor device according to another embodiment of the present invention.

Please refer to FIG. 10, which is a schematic drawing showing a plan view of a semiconductor device according to another embodiment of the present invention. By adjusting the dry etching or wet etching of the second etching step the etching process E1, the shapes and dimensions of the deep holes 22 may be adjusted to produce dielectric insert structures 30a with desired shapes and dimensions according design needs. As shown in the upper portion of FIG. 10, the dielectric insert structures 30a may have rounded bottom surfaces conformal to the shapes of the deep holes 22 where the dielectric insert structures 30a are formed. As shown in the lower portion of FIG. 10, for the substrate 10 made of single crystal silicon, a wet etching step using tetramethylammonium hydroxide (TMAH), potassium hydroxide (KOH), and/or ethylenediamine pyrocatechol (EDP) may be performed to etch the substrate 10 to obtain deep holes 22 with bottom portions having sidewalls along crystalline surfaces of the substrate 10 and rhombus-shaped or diamond-shaped cross-sectional profiles. Accordingly, the dielectric insert structures 30a formed at the bottom portions of the deep holes 22 may have a rhombus-shaped or diamond-shaped cross-sectional profile, respectively. In some embodiments, each of the dielectric insert structures 30a may include a sidewall at an angle of approximately 54.7 degrees with respect to a direction along the surface of the substrate 10. In some embodiments, by adjusting the lateral etching rate of the wet etching step, the width W4 of the widest part of each of the dielectric insert structures 30a may be larger than the width W3 of the buried word lines WL over the dielectric insert structures 30a. Other shapes of the dielectric insert structures 30a not exemplarily illustrated herein are also be encompassed within the scope of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a substrate of a first conductivity type, comprising a plurality of active regions arranged adjacent to each other to form an array;
   an isolation structure in the substrate to separate the active regions;
   a buried word line disposed in the substrate and cutting through the isolation structure and the active regions;
   a dielectric insert structure disposed in the substrate, directly under the buried word line and between end portions of adjacent two of the active regions, wherein the dielectric insert structure comprises dopants of a second conductivity type that is opposite to the first conductivity type; and
   a doped region in the substrate and directly contacting a sidewall and a bottom surface of the dielectric insert structure, wherein the doped region has the second conductivity type.

2. The semiconductor device according to claim 1, wherein the isolation structure and the dielectric insert structure comprise different materials.

3. The semiconductor device according to claim 1, wherein a bottom surface of the isolation structure is lower than a bottom surface of the buried word line.

4. The semiconductor device according to claim 1, wherein a sidewall of the dielectric insert structure directly contacts the isolation structure.

5. The semiconductor device according to claim 1, wherein the buried word line comprises:
   a gate dielectric layer, being in direct contact with the dielectric insert structure;
   a conductive layer disposed on the gate dielectric layer; and
   a capping layer disposed on the conductive layer.

6. The semiconductor device according to claim 1, wherein a width of the dielectric insert structure is smaller than a width of the buried word line.

7. The semiconductor device according to claim 1, wherein a width of the dielectric insert structure is larger than a width of the buried word line.

8. The semiconductor device according to claim 1, wherein a sidewall of the dielectric insert structure and a direction along a surface of the substrate comprise an angle of 54.7 degrees.

9. A method for forming a semiconductor device, comprising:
   providing a substrate of a first conductivity type;
   forming an isolation trench in the substrate to define a plurality of active regions;
   forming a first dielectric layer in the isolation trench and comprising a plurality of deep holes that are respectively located between end portions of adjacent two of the active regions;
   performing an etching process to extend each of the deep holes into the substrate and being lower than a bottom surface of the isolation trench;
   forming a second dielectric layer filling the deep holes, wherein the second dielectric layer comprises dopants of a second conductivity type;
   forming a word line trench in the substrate and cutting through the active regions, the first dielectric layer, and the second dielectric layer, wherein portions of the second dielectric layer at bottom portions of the deep holes become a plurality of dielectric insert structures under the word line trench;
   forming a doped region of the second conductivity type in the substrate and directly contacting a sidewall and a bottom surface of the dielectric insert structure, wherein the second conductivity type that is opposite to the first conductivity type; and
   forming a buried word line in the word line trench.

10. The method for forming a semiconductor device according to claim 9, wherein the first dielectric layer and the second dielectric layer comprise different materials.

11. The method for forming a semiconductor device according to claim 9, wherein a bottom surface of the isolation trench is lower than a bottom surface of the word line trench.

12. The method for forming a semiconductor device according to claim 9, wherein the etching process comprises:
   a dry etching step to remove the first dielectric layer at bottom portions of the deep holes to expose portions of the substrate; and
   a wet etching step to etch the exposed portions of the substrate.

13. The method for forming a semiconductor device according to claim 9, wherein the step of forming the buried word line comprises:
   forming a gate dielectric layer along a bottom surface and a sidewall of the word line trench, wherein the gate dielectric layer is in direct contact with the plurality of dielectric insert structures;
   forming a conductive layer on the gate dielectric layer; and
   forming a capping layer on the conductive layer.

14. The method for forming a semiconductor device according to claim 9, wherein a width of the dielectric insert structures is smaller than a width of the buried word line.

15. The method for forming a semiconductor device according to claim 9, wherein a width of the dielectric insert structures is larger than a width of the buried word line.

16. The method for forming a semiconductor device according to claim 9, wherein the bottom portions of the deep holes extending into the substrate respectively have a rhombus-shaped or diamond-shaped cross-sectional profile.

17. A method for forming a semiconductor device, comprising:
   providing a substrate;
   forming an isolation trench in the substrate to define a plurality of active regions;
   forming a first dielectric layer in the isolation trench and comprising a plurality of deep holes that are respectively located between end portions of adjacent two of the active regions;
   performing an etching process to extend each of the deep holes into the substrate and being lower than a bottom surface of the isolation trench, wherein the etching process comprises:
      a dry etching step to remove the first dielectric layer at bottom portions of the deep holes to expose portions of the substrate; and
      a wet etching step to etch the exposed portions of the substrate;
   forming a second dielectric layer filling the deep holes;
   forming a word line trench in the substrate and cutting through the active regions, the first dielectric layer, and the second dielectric layer, wherein portions of the second dielectric layer at bottom portions of the deep holes become a plurality of dielectric insert structures under the word line trench; and
   forming a buried word line in the word line trench.

* * * * *